United States Patent [19]
Gillberg et al.

[11] 4,216,393
[45] Aug. 5, 1980

[54] DRIVE CIRCUIT FOR CONTROLLING CURRENT OUTPUT RISE AND FALL TIMES

[75] Inventors: James E. Gillberg, N. Plainfield; Nicholas Kucharewski, Lebanon, both of N.J.

[73] Assignee: RCA Corporation, New York, N.Y.

[21] Appl. No.: 945,603

[22] Filed: Sep. 25, 1978

[51] Int. Cl.² .......................... H03F 3/16; H03F 3/193; H03K 1/10
[52] U.S. Cl. .................................... 307/270; 307/263; 330/288; 330/300
[58] Field of Search .................... 307/200 B, 263, 268, 307/270, DIG. 1; 330/288, 300

[56] References Cited

U.S. PATENT DOCUMENTS

| | | | |
|---|---|---|---|
| 3,644,838 | 2/1972 | Graf | 330/300 X |
| 3,943,380 | 3/1976 | Morgan | 330/288 X |
| 4,038,607 | 7/1977 | Schade, Jr. | 330/288 X |
| 4,047,059 | 9/1977 | Rosenthal | 330/288 X |
| 4,064,506 | 12/1977 | Cartwright, Jr. | 330/288 X |
| 4,068,184 | 1/1978 | Ahmed | 330/288 X |
| 4,069,431 | 1/1978 | Kucharewski | 330/288 X |
| 4,078,206 | 3/1978 | Crowle | 330/300 X |
| 4,092,612 | 5/1978 | Schade, Jr. | 330/300 X |
| 4,117,416 | 9/1978 | Schade, Jr. | 330/300 X |
| 4,152,663 | 5/1979 | Van De Sande | 330/288 X |

*Primary Examiner*—Larry N. Anagnos
*Attorney, Agent, or Firm*—J. M. O'Meara; Allen LeRoy Limberg; Allan J. Jacobson

[57] ABSTRACT

In a drive circuit having output current passing through at least one bipolar transistor, the rise and fall times of the output current are predetermined by controlling the rate of current change in the master path of a current mirror amplifier which has a separate slave path connected to supply base current for each bipolar transistor. The drain-source channel of an MOS transistor is connected to selectively supply current flow through the master path of the current mirror amplifier in one embodiment of the rate control means and the gate of the MOS transistor is connected in parallel with a capacitor to the output of a CMOS inverter to which control signals are applied. Multiple outputs are driven from a single control input in another embodiment having a single master path and multiple slave paths incorporated into the current mirror amplifier with each slave path being connected to supply base current for a separate bipolar output transistor and being coupled to the master path through a separate transmission gate in a decoder which includes a transmission gate for each slave path.

4 Claims, 2 Drawing Figures

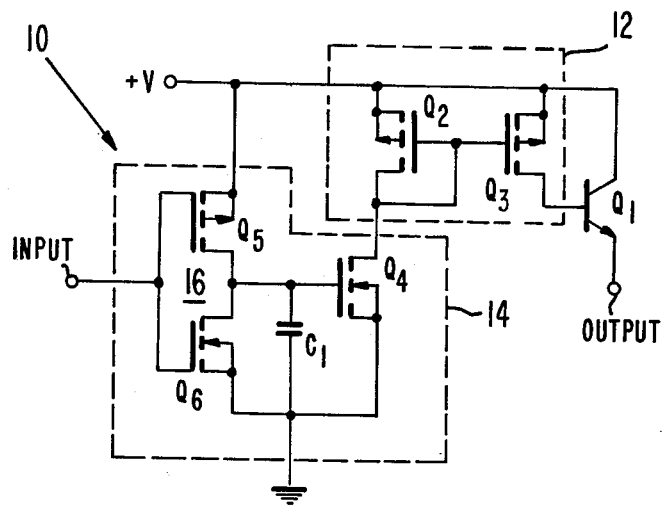
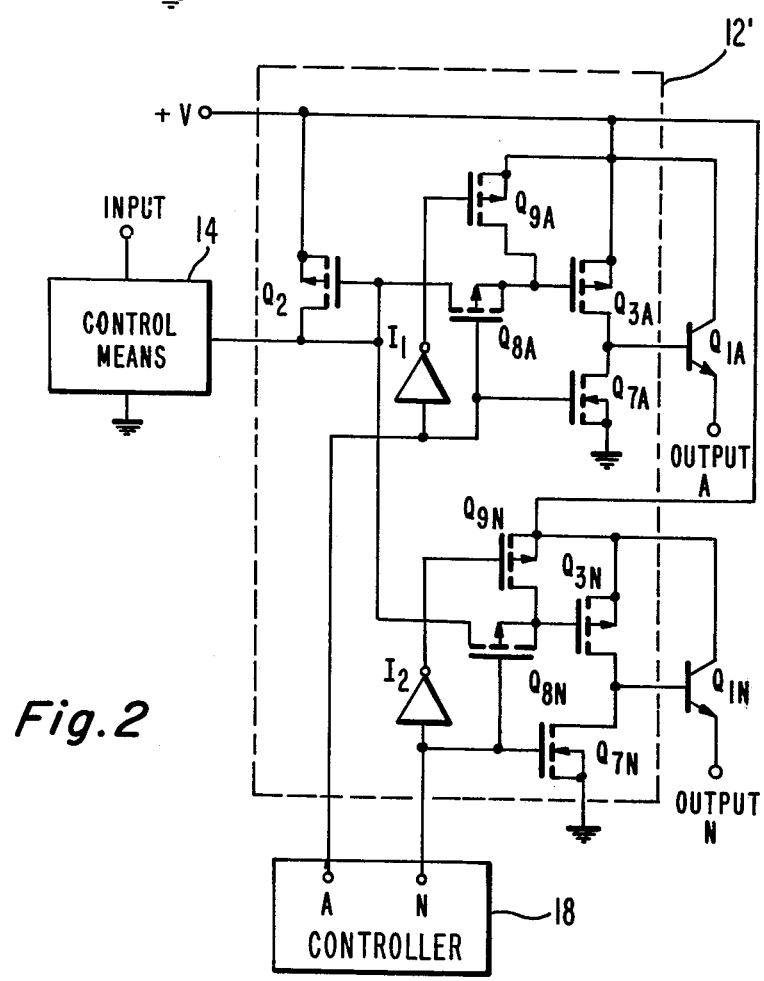
Fig. 1
Fig. 2

DRIVE CIRCUIT FOR CONTROLLING CURRENT OUTPUT RISE AND FALL TIMES

The present invention relates to drive circuits wherein the rise and fall times of the output current are controlled to reduce the levels of radio frequency interference (RFI) generated.

As is well known in the art, when current levels are rapidly changed RFI is generated. The operation of many circuits is affected by RFI which, for example, causes noise when picked up by radios. Consequently, the RFI problem must be given due consideration where current drive circuits are to be incorporated in proximity with many other types of circuits, such as in a digital clock radio. Many solutions to the RFI problem are known; however, few of these solutions can be conveniently incorporated within digital circuitry, especially where a multiplicity of outputs are utilized.

The RFI problem is overcome in the drive circuit of the invention by controlling the rate of current change in the master path of a current mirror amplifier (CMA) which has at least one slave path connected to supply base current for a bipolar transistor through which the output current is supplied. The drain-source channel of a MOS transistor is disposed to interrupt current flow through the master path of the CMA in one embodiment with the input of the transistor connected in parallel with a capacitor across the output of a CMOS inverter to which a control signal is applied. Where a multiplicity of outputs are desired from a digital control signal, a single master path and a plurality of slave paths are incorporated into the CMA, with each slave path being connected to supply base current for a separate bipolar output transistor and being coupled to the master path through a separate transmission gate which is controlled by a decoder that also includes transmission gates for the other slave paths.

In the drawings:

FIG. 1 is a block diagram for the drive circuit of the invention and the schematic for one embodiment is also illustrated therein; and FIG. 2 is a schematic diagram for one embodiment of a current mirror amplifier that may be utilized in the drive circuit of the invention where a control signal must be synchronized with the multiple outputs of a controller.

The drive circuit of this invention controls the change rate of output current and in a particular application thereof it is utilized to reduce RFI generation. A block diagram for such a drive circuit 10 is shown in FIG. 1 wherein output current is applied from a voltage source $+V$ through the main conduction path of a bipolar transistor $Q_1$. The slave path of a CMA 12 is connected to the base of $Q_1$, while a control means 14 for changing the level of current flow through the master path of CMA 12 at a predetermined rate is arranged to respond to an input signal.

The output current level of the drive circuit 10 is equal to the base current of $Q_1$ multiplied by the common-emitter forward gain (Beta) of that transistor. As is well-known in the art, current flow through the slave path is directly proportional to current flow through the master path in the CMA 12 and because the slave path current is supplied to the base of $Q_1$, the output current of the drive circuit must be proportional to the master path current level. Therefore, when the control means 14 changes the current level in the master path of the CMA 12 at a predetermined rate, it thereby causes the output current of the drive circuit to change at the same rate.

Although many embodiments of the invention are possible in regard to both the CMA 12 and the control means 14, integrated circuitry for the preferred embodiments thereof is illustrated in FIG. 1. The CMA 12 includes MOS transistors $Q_2$ and $Q_3$ which are connected in the master and slave paths respectively, with one side of the drain-source channel in each transistor being commonly connected to $+V$. The gate electrodes of both $Q_2$ and $Q_3$ are commonly connected to the other side of the drain-source channel in $Q_2$, while the other side of the drain-source channel in $Q_3$ is connected to the base of $Q_1$. Within the control means 14, the drain-source channel of a MOS transistor $Q_4$ is connected to selectively supply current flow through the master path of the CMA 12. The gate of $Q_4$ is connected to the output of a CMOS inverter 16 having complementary MOS transistors $Q_5$ and $Q_6$ disposed with their gates commonly connected at the input of the drive circuit 10, and with their drain-source channels connected in series between $+V$ and a reference voltage such as ground. The output from inverter 16 is taken from the connection between the drain-source channels of $Q_5$ and $Q_6$, and a capacitor $C_1$ is connected between this output and ground.

Because $Q_4$ is an n-channel enhancement-type, current flow through its drain-source channel is normally cut-off while its gate-source voltage is less positive than its threshold or turn-on voltage. Therefore, current only flows through the master path of the CMA 12 when $C_1$ has been charged from $+V$ through the drain-source channel of $Q_5$ to at least the positive threshold gate-source voltage of $Q_4$. Because $Q_5$ is a p-channel type, its negative threshold gate-source voltage must be reached by the input signal that is applied to the CMOS inverter 16 for $C_1$ to be charged from $+V$. Furthermore, $Q_6$ is an n-channel type and therefore, $C_1$ is discharged to ground through its drain-source channel whenever its positive threshold gate-source voltage is reached by the input signal that is applied to the CMOS inverter 16. Consequently, current flow in the master path of the CMA 12 is initiated by a negative input signal on the control means 14 relative to $+V$ and is interrupted by a positive input signal thereon relative to ground. However, the level of current flow through this master path only changes at a rate which is proportional to either the charge or discharge rate of $C_1$. Consequently, the level of current flow in the slave path of the CMA 12 also changes at a rate porportional with either the charge or discharge rate of $C_1$ because it is directly proportional to the level of current flow in the master path. Therefore, the output current level of the drive circuit 10 which is proportional to level of current supplied through the slave path to the base of $Q_1$, changes at a rate proportional with either the charge or discharge rate of $C_1$. As to the charge rate of $C_1$, it is determined by the time constant derived from the channel resistance of $Q_5$ multiplied by the size of $C_1$, while the discharge rate of $C_1$ is determined by the time constant derived from the channel resistance of $Q_6$ multiplied by the size of $C_1$.

Although enhancement-type MOS transistors are utilized in the circuitry of FIG. 1, depletion-type MOS transistors may be utilized in other embodiments of this invention. Also, the conductivity type of either the MOS transistors or the bipolar transistor $Q_1$ could be changed where the input signal, the voltage source, and the reference voltage of the drive circuit 10 are of appropriate polarities. Furthermore, the appropriate time constants for predetermined charge and discharge rates of $C_1$ may be derived by fixing the width to length ratio of the channels in Q5 and Q6 to determine the channel resistances of these transistors. Of course, the size of $C_1$ could also be fixed for this purpose while $C_1$ could be variable or a variable resistor could be disposed in either the charge or discharge paths to provide for adjustable time constants where the invention is practiced in discrete circuitry. Those skilled in the art will therefore realize without further explanation that the rate of change in output current from the drive circuit of the invention may be readily predetermined to avoid the generation of RFI.

The drive circuit of this invention is particularly appropriate for use in the digital drive circuitry of LED clocks, when adjacent to any radio, where RFI must be reduced. One such application is found in the circuitry of an LED time readout clock radio wherein each LED is synchronized with a digital signal through a time decoder or controller by the drive circuit of the invention. Of course, drive circuits utilizing this form of interconnection are commonly used without this invention to control output rise and fall times however substantial RFI is generated by such circuits. The widely adopted solution for minimizing RFI where these circuits are incorporated has been to enclose the circuit completely by a grounded conductive shield, known in the art as a Faraday shield. However, this manufacturing process substantially increases the cost and complexity of the clock and is not always completely effective. A second solution used to eliminate the RFI is to drive each separate drive segment with its own control line eliminating the time decoder and controller. However, this will substantially increase the number of terminal pins required for information output from the monolithic unit and thus possibly limit the use to a restricted number of applications.

As shown in FIG. 2, a modified CMA 12' can be incorporated into the drive circuit 10 of FIG. 1 to provide multiple outputs. A plurality of slave paths are included in the CMA 12' equal in number to the desired number of outputs which are represented in FIG. 2 by only the first and last outputs A and N. Gates are incorporated to synchronize the current flow in each slave path with a controller 18. Each output A through N is applied through a bipolar transistor $Q_{1A}$ through $Q_{1N}$ respectively. Base current is applied to $Q_{1A}$ through $Q_{1N}$ from +V through separate slave paths which include the drain-source channels of MOS transistors $Q_{3A}$ through $Q_{3N}$ respectively. The bases of $Q_{1A}$ through $Q_{1N}$ are also connected to ground through the drain-source channels of MOS transistors $Q_{7A}$ through $Q_{7N}$ respectively, which are of the complementary conductivity type to $Q_{3A}$ through $Q_{3N}$. The gates of $Q_{3A}$ through $Q_{3N}$ are connected through the drain-source channels of MOS transistors $Q_{8A}$ through $Q_{8N}$ respectively, to the master path of the CMA 12' at the gate of Q2. The gates of $Q_{3A}$ through $Q_{3N}$ are also connected to +V through the drain-source channels of MOS transistors $Q_{9A}$ through $Q_{9N}$ respectively. Signal terminal A on the controller 18 is connected to the gates of $Q_{7A}$, $Q_{8A}$ and to the gate of $Q_{9A}$ through an inverter $I_1$, while signal terminal N on the controller is connected to the gates of $Q_{7N}$, $Q_{8N}$ and to the gate of $Q_{9N}$ through an inverter $I_2$.

The CMA 12' functions to supply current at each of the outputs A through N in substantially the same manner as was described previously in regard to the circuitry of FIG. 1. At any particular moment, however, current is supplied at each individual output A through N in accordance with the levels of both the input signal being applied to the control means 14 and the A through N signal terminals of the controller 18. This is so because $Q_2$ in the sole master path is connected respectively to $Q_{3A}$ through $Q_{3N}$ in each slave path through $Q_{8A}$ through $Q_{8N}$ which function as transmission gates in response to the levels at the A through N signal terminals respectively of the controller 18. Since $Q_{8A}$ through $Q_{8N}$ are p-channel enhancement type, these transistors are only conductive when their appropriate A through N signal terminal on the controller 18 applies at least their negative threshold gate-source voltage. Therefore, current is only supplied at each output A through N when both the input signal on the control means 14 and the appropriate A through N signal terminal on the controller 18 are both negative relative to +V.

$Q_{7A}$ through $Q_{7N}$ and $Q_{9A}$ through $Q_{9N}$ are also responsive to the A through N signal terminals on the controller 18 and become conductive respectively to dissipate any residual charge on the bases of $Q_{1A}$ through $Q_{1N}$ and on the gates of $Q_{3A}$ through $Q_{3N}$ when the transmission gates $Q_{8A}$ through $Q_{8N}$ are non-conductive. Therefore, $Q_{7A}$ through $Q_{7N}$ and $Q_{9A}$ through $Q_{9N}$ are respectively conductive to assure that no current is supplied at the outputs A through N when the A through N signal terminals on the controller 18 are equal to +V.

Although this invention has been disclosed herein by describing only a few embodiments thereof, it should be understood by those skilled in the art that numerous changes in the details of construction and the combination or arrangement of parts could be made in the described embodiments without departure from the true scope and spirit of the invention. Therefore, the present disclosure should be construed as illustrative rather than limiting.

What we claim is:

1. In a drive circuit of the type wherein current is supplied to at least one output terminal and each output terminal is connected to a voltage source through a respective bipolar transistor, the improvement comprising:

a current mirror amplifier having a master path and at least one slave path, each said slave path being connected to drive the base of one bipolar transistor; and control means for changing the level of current flow through said master path at a predetermined rate wherein said control means includes a first MOS transistor having its drain-source channel connected to selectively supply current flow through said master path and having its gate connected to respond to a control signal through a resistance-capacitance combination by which a time constant is fixed in proportion with said predetermined rate of the current level change in said master path.

2. The drive circuit of claim 1 wherein said control means includes a capacitor and a second and third MOS transistors of complementary types, said second and third transistors having their gates commonly connected to said control signal and having their drain-source channels series connected between the voltage source and a reference voltage, said first transistor having its gate connected between the drain-source channels of said second and third transistors, said capacitor being connected between the gate of said first transistor and said reference voltage, said master path becoming current conductive as said capacitor is charged from the voltage source through the drain-source channel of said second transistor, said time constant while said capacitor is charged being equal to the channel resistance of said second transistor multiplied by the value of said capacitor, said master path becoming non-conductive of current as said capacitor is discharged to said reference voltage through the drain-source channel of said third transistor, said time constant while said capacitor is discharged being equal to the channel resistance of said third transistor multiplied by the value of said capacitor.

3. The drive circuit of claim 1 wherein said current mirror amplifier includes an individual MOS transistor in said master path and in each slave path; each said transistor having one side of their drain-source channels commonly connected to the voltage source and their gate electrodes commonly connected to said master path at the other side of the drain-source channel in said master path transistor; each said slave path transistor having the other side of its drain-source channel connected to drive the base of a respective one of the bipolar transistors.

4. In a drive circuit of the type wherein current is supplied to at least one output terminal and each output terminal is connected to a voltage source through a respective bipolar transistor, the improvement comprising:
a current mirror amplifier having a master path and at least one slave path, each said slave path being connected to drive the base of one bipolar transistor; and
control means for changing the level of current flow through said master path at a predetermined rate to thereby fix the rate at which the output current changes;
wherein said current mirror amplifier includes an individual MOS transistor in said master path and in each slave path; each said transistor having one side of their drain-source channels commonly connected to the voltage source and their gate electrodes commonly connected to said master path at the other side of the drain-source channel in said master path transistor; each said slave path transistor having the other side of its drain-source channel connected to drive the base of a respective one of the bipolar transistors; and
wherein each said slave path transistor is disposed with its gate electrode connected to said master path through the drain-source channel of a separate first MOS transistor and to the source voltage through the drain-source channel of a separate second MOS transistor, while its drain-source channel connection with the base of the bipolar transistor is grounded through the drain-source channel of a separate third MOS transistor; said second transistor for each said slave path being of the same conductivity type as said first transistor for that slave path; said third transistor for each said slave path being of the opposite conductivity type to said first transistor for that slave path; each said slave path transistor having the gate electrodes of its first and third transistors commonly connected to separate signal terminals on a controller and having the gate electrode on its second transistor connected through an inverter to the separate signal terminals on said controller; said first, second and third transistors associated with each said slave path responding to the level at their controller signal terminal with said first transistor being conductive when said second and third transistors are nonconductive to render said respective slave path transistor conductive and thereby render the respective bipolar transistor conductive to supply current at its output terminal and with said second and third transistors being conductive when said first transistor is nonconductive to render said respective slave path transistor nonconductive and thereby render the respective bipolar transistor nonconductive.

* * * * *